US009964621B2

(12) United States Patent
Basha et al.

(10) Patent No.: US 9,964,621 B2
(45) Date of Patent: May 8, 2018

(54) METHODS AND APPARATUS FOR REDUCING SCAN TIME OF PHASE CONTRAST MRI

(71) Applicant: Beth Israel Deaconess Medical Center, Inc. (BIDMC), Boston, MA (US)

(72) Inventors: Tamer Basha, Revere, MA (US); Reza Nezafat, Newton, MA (US)

(73) Assignee: Beth Israel Deaconess Medical Center, Inc., Boston, MA (US)

( * ) Notice: Subject to any disclaimer, the term of this patent is extended or adjusted under 35 U.S.C. 154(b) by 830 days.

(21) Appl. No.: 14/501,936

(22) Filed: Sep. 30, 2014

(65) Prior Publication Data

US 2015/0097565 A1   Apr. 9, 2015

Related U.S. Application Data

(60) Provisional application No. 61/885,117, filed on Oct. 1, 2013.

(51) Int. Cl.
*G01R 33/48* (2006.01)
*G01R 33/561* (2006.01)
*G01R 33/563* (2006.01)

(52) U.S. Cl.
CPC ..... *G01R 33/5616* (2013.01); *G01R 33/4824* (2013.01); *G01R 33/5611* (2013.01); *G01R 33/56316* (2013.01)

(58) Field of Classification Search
CPC ............ G01R 33/4824; G01R 33/5611; G01R 33/5616; G01R 33/56316
See application file for complete search history.

(56) References Cited

U.S. PATENT DOCUMENTS

| 6,442,414 | B1 | 8/2002 | Watanabe | |
|---|---|---|---|---|
| 9,002,430 | B2* | 4/2015 | Riederer | G01R 33/4818 600/419 |
| 2012/0099774 | A1* | 4/2012 | Akcakaya | G06T 11/008 382/131 |

(Continued)

FOREIGN PATENT DOCUMENTS

WO   2012/028955 A2   3/2012
WO   2012/127341 A1   9/2012

OTHER PUBLICATIONS

Hung-Yu Lin, M.S., Real-Time Flow Quantification Techniques in Cardiovascular MRI Applications, The Ohio State University, 2009, pp. 1-240.

(Continued)

*Primary Examiner* — Gregory H Curran
(74) *Attorney, Agent, or Firm* — Cha & Reiter, LLC

(57) ABSTRACT

A method and apparatus for reducing scan time, eddy currents and image factors in dynamic magnetic resonance (MR) imaging associated with at least a portion a k-space. The method includes scanning at least a portion of the k-space with an Echo-Planar Imaging (EPI) pulse sequence technique, acquiring a randomly under-sampled k-space; and reconstructing the under-sampled k-space utilizing a constrained reconstruction technique. A dynamic image is constructed of the at least a portion of the k-space based on EPI and the randomly undersampled k-space techniques to each segment of the EPI pulse sequence technique.

24 Claims, 16 Drawing Sheets

(56) References Cited

U.S. PATENT DOCUMENTS

2013/0089271 A1\* 4/2013 Boernert ................ G01N 24/08
                                                                                  382/274
2014/0039300 A1\* 2/2014 Gjesdal .................. A61B 5/055
                                                                                  600/420

OTHER PUBLICATIONS

Yiu-Cho Chung et al., Centric Reordered Echo Planar Imaging (EPI) for Phase Contrast MRI, BioMed Central, Journal of Cardiovascular Magnetic Resonance, pp. 1-2, Jan. 21, 2010.

\* cited by examiner a. 2D Breath-Hold, SENSE 2, FOV = 260x330mm, Res = 2.5x2.5,
Phase Interval = 21msec, Scan Time = 0:13sec b. 3D, EPI = 3, CS = 3 , FOV=260x330x60mm, Res = 2x2x3mm
Phase Interval = 30msec, Scan Time = 2:50sec

METHODS AND APPARATUS FOR REDUCING SCAN TIME OF PHASE CONTRAST MRI

CLAIM OF PRIORITY

This application claims priority from U.S. provisional application 61/885,117 filed Oct. 1, 2013, the contents of which are incorporated by reference in its entirety.

BACKGROUND

1. Field of the Disclosure

The present disclosure relates to Magnetic Resonance Imaging (MRI) methods that provide imaging with reference to time. More particularly, the present disclosure relates to improvements in scan time for MR imaging, in particularly accelerated 4D flow imaging.

2. Description of the Related Art

Medical imaging devices provide images of certain internal portions of a patient's body, and provides a vitally important tool in the detection and treatment of various medical conditions. Various types of medical imaging devices exist and often having respective advantages associated with performing imaging of different areas of the body to be viewed, such as ultrasonic diagnostic equipment, x-ray tomography equipment, magnetic resonance imaging equipment, and medical diagnostic equipment.

In general, magnetic resonance (MR) imaging equipment functions provide superior contrast images of soft tissues of a human body, as well as provide various types of diagnostic information. Therefore (MR) imaging equipment is a critical resource for diagnostic technology using medical images.

Image reconstruction in an MRI apparatus involves decoding of measured signals in order to identify and map spatial frequency components to spatial locations. While conventional Fourier reconstruction methods have been improved upon in recent years, constrained reconstruction methods use a priori information in order to compensate for a lack of high frequency data in a reconstruction process. Thus, the additional information to restore information beyond a measurement cutoff can be derived.

In addition, k-space refers to a matrix of spatial frequencies that has a mathematical relationship to an image (whose Fourier transform is the MR image), and in the case of digitized MRI signal data, virtually every point in k-space represents a spatial frequency and is used to add to signal intensity.

Moreover, Echo Planar Imaging (EPI) is a methodology that is used in part to obtain medical images. With regard to EPI, rather than measuring a single echo subsequent to transmitting a pulse, EPI permits the acquisition of many echoes. EPI is used to acquire more signals from an excitation pulse.

The use of EPI is seen as one possible way to reduce scan time because multiple k-space lines can be acquired for each phase, which is beneficial to Phase Contrast (PC) imaging in which flow encoding gradients are applied after each RF excitation.

However, conventionally, there have been some issues with EPI. While the acquisition time per slice with EPI can be on order of 100 ms/slice, there is a rather limited spatial resolution.

Recent advances in both hardware and software MR technologies have permitted EPI to be used for faster, higher temporal and spatial resolution flow imaging. However the importance of k-space trajectories used in EPI sequences increases when using EPI for faster, higher temporal images.

In general, a magnetic resonance (MR) imaging device includes imaging equipment that diagnoses internal structures of a human body using the energy—already converted to a signal—induced from resonance reactions obtained by applying a constant rate of frequency and energy to nuclei of atoms of a patient while a predetermined magnetic field is applied to the patient.

MR imaging extends beyond conventional 2D imagery, for example, 3D MRI, in which two dimensional slices are joined together so as to permit a 3-dimensional model, and dynamic imaging such as flow sensitive 4D MRI, which provides ECG synchronized flow sensitive 3DMRI. Flow sensitive 4D MRI data permits a useful quantification if items being directly measured, show as flow rates, and permits the use of pressure difference maps, pulse wave velocity, etc. Flow sensitive 4D MRI can permit analysis of blood flow through peripheral blood vessels, carotid artery, intracranial arteries, artificial valves, etc.

The scan time associated with dynamic imaging can be significantly long, on upwards of 30 minutes. Not only does this extended time increase costs of operation, but also discourages the use of such scanning as the accuracy and validity of such resulting data. Patients do not like and/or are sometimes able to be still for such a length of time, particularly when enclosed within a confined scanning area of the MRI apparatus.

Image reconstruction in an MRI apparatus involves decoding of measured signals in order to identify and map spatial frequency components to spatial locations. While conventional Fourier reconstruction methods have been improved upon in recent years, constrained reconstruction methods use a priori information in order to compensate for a lack of high frequency data in a reconstruction process. Thus, the additional information to restore information beyond a measurement cutoff can be derived.

In addition, k-space refers to a matrix of spatial frequencies that has a mathematical relationship to an image (whose Fourier transform is the MR image), and in the case of digitized MRI signal data, virtually every point in k-space represents a spatial frequency and is used to add to signal intensity.

Moreover, Echo Planar Imaging (EPI) is a methodology that is used in part to obtain medical images. With regard to EPI, rather than measuring a single echo subsequent to transmitting a pulse, EPI permits the acquisition of many echoes. EPI is used to acquire more signals from an excitation pulse.

The use of EPI is seen as one possible way to reduce scan time because multiple k-space lines can be acquired for each phase, which is beneficial to Phase Contrast (PC) imaging in which flow encoding gradients are applied after each RF excitation.

However, conventionally, there have been some issues with EPI. While the acquisition time per slice with EPI can be on order of 100 ms/slice, there is a rather limited spatial resolution.

Recent advances in both hardware and software MR technologies have permitted EPI to be used for faster, higher temporal and spatial resolution flow imaging. However, the importance of k-space trajectories used in EPI sequences increases when using EPI for faster, higher temporal images.

There is difficulty in providing high-resolution MRI of an object when there is motion is involved, for example, an MRI of organs such as the coronary arteries, lungs, etc. associated with both cardiac and respiratory motion. While there can be temporal triggering as the motion tends to be generally repetitive motion, the amount of scan time that can be needed to obtain an acceptable image can be excessive.

Moreover, heretofore it has not been feasible to obtain dynamic image with a 4D cine phase contrast as part of a clinical cardiac MRI protocol, as such cardiac MRI protocol includes evaluations of items such as function, anatomy, and scar imaging.

Accordingly, there is a long-felt need in the art to decrease the scan time of EPI methodologies when utilizing MR imaging in dynamic imaging, including but in no way limited to, for example, a 4D-PC flow imaging.

SUMMARY

The present disclosure provides a novel acquisition method and apparatus to reduce scan time in dynamic magnetic resonance (MR) imaging such as dynamic contrast enhanced or phase contrast MRI associated with obtaining and image processing at least a portion of the k-space. A data sampling strategy such as EPI is combined with the use of a randomly undersampled reconstruction to reduce eddy currents. The claimed invention is applicable to any type of reconstruction, including for example, a randomly undersampled y-z pattern, or a 3D k-space sampling pattern. While compressed sensing (CS) can be used to permit reconstruction of a signal utilizing a signal's sparseness or compressibility, there are a number of other ways in which a signal may be reconstructed with fewer samples than a conventional sampling theorem that requires a sampling rate/density of a continuous function reduced to a discrete sequence and then interpolated back to a continuous function according to the present disclosure. Accordingly, by combining the pulse sequences of EPI methodology with random undersampling, reduced scan times for dynamic imaging heretofore unknown can be achieved.

In one aspect, a random undersampling of the k-space provides sparseness that can be used with non-Cartesian samples, including radial ordering. The method and apparatus as disclosed herein operate to reduce a number of image artifacts that are normally associated with undersampling.

The spatio-temporal variations in flow images are limited to blood vessel region such that the image data can be easily sparsified in an appropriate transform domain. Flow quantification from flow image is basically based on a subtraction operation between the two phase images, advantageously permitting residual artifacts to be removed. In addition, the use EPI saves repetitions of relatively long flow encoding gradients that are applied after each RF excitation, thus reducing scan time.

A method for reducing scan time in dynamic magnetic resonance (MR) dynamic contrast enhanced or phase contrast MRI associated with at least a portion a k-space may include the following tasks: Starting with a fully sampled k-space, divide the k-space profiles into $R_{EPI}$ segments, based on an EPI factor acquiring a randomly under-sampled k-space; and reconstructing the under-sampled k-space utilizing a constrained reconstruction technique; and constructing a dynamic image of said at least a portion of the k-space based on EPI and randomly undersampled k-space techniques to each segment of the EPI pulse sequence technique to reduce the impact of Eddy current and other confounding imaging factors.

An apparatus for a magnetic resonance image (MRI) system for obtaining dynamic MRI image data of at least a portion of the k-space with reduced eddy currents, scanning time and image factors when obtaining the dynamic MRI image, the apparatus includes an image processing system including a processor having circuitry configured to: provide constrained reconstruction of an Echo-Planar Imaging (EPI) pulse sequence technique, acquire a randomly undersampled k-space; reconstruct the under-sampled k-space utilizing a constrained reconstruction technique; and construct a dynamic image of said at least a portion of the k-space based on EPI and the randomly undersampled k-space constrained reconstruction techniques to each segment of the EPI pulse sequence technique and to applying a radial ordering mechanism to each EPI segment. In addition, a control unit can be configured to control at least the image processing system.

The constrained reconstruction technique may comprise a compressed sensing (CS) reconstruction technique.

A method for reducing a magnetic resonance (MR) imaging scan time associated is also applicable with dynamic imaging of at least a portion of a k-space includes: scanning at least a portion of the k-space with an Echo-Planar Imaging (EPI) pulse sequence technique; acquiring a randomly under-sampled k-space; scanning the under-sampled k-space utilizing a compressed sensing reconstruction technique; and constructing an image of said at least a portion of the k-space based on a combining EPI and CS reconstruction techniques by applying a radial ordering to each segment of the EPI pulse sensing technique.

BRIEF DESCRIPTION OF THE DRAWINGS

FIG. 1C is a pulse sequence diagram for the Phase Contrast sequence with an

Figure 2:
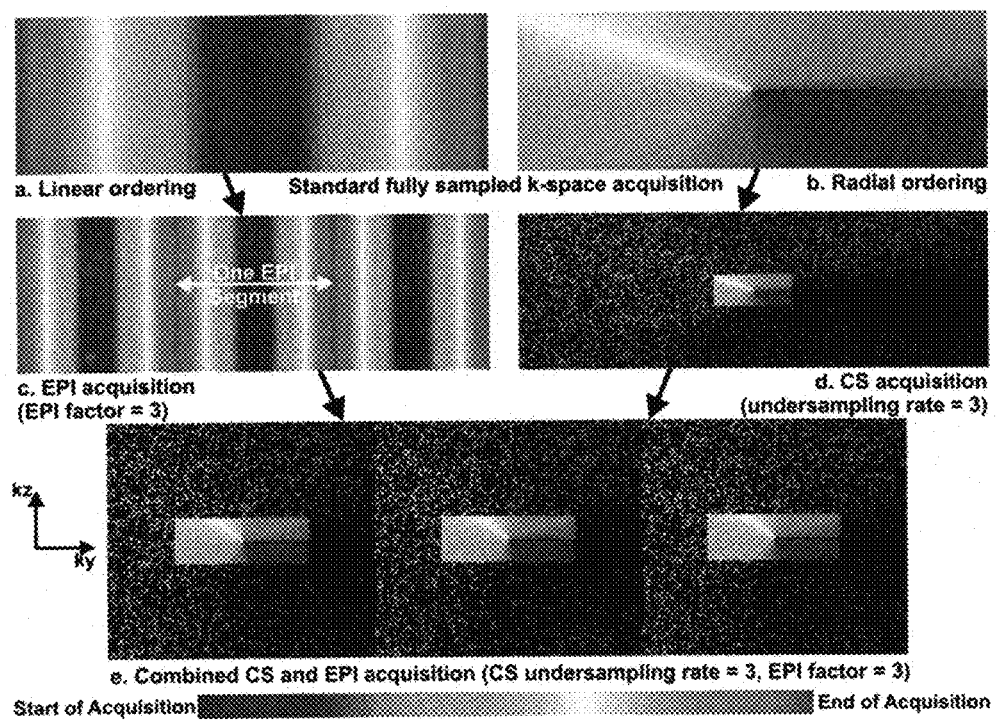
Figure 3:
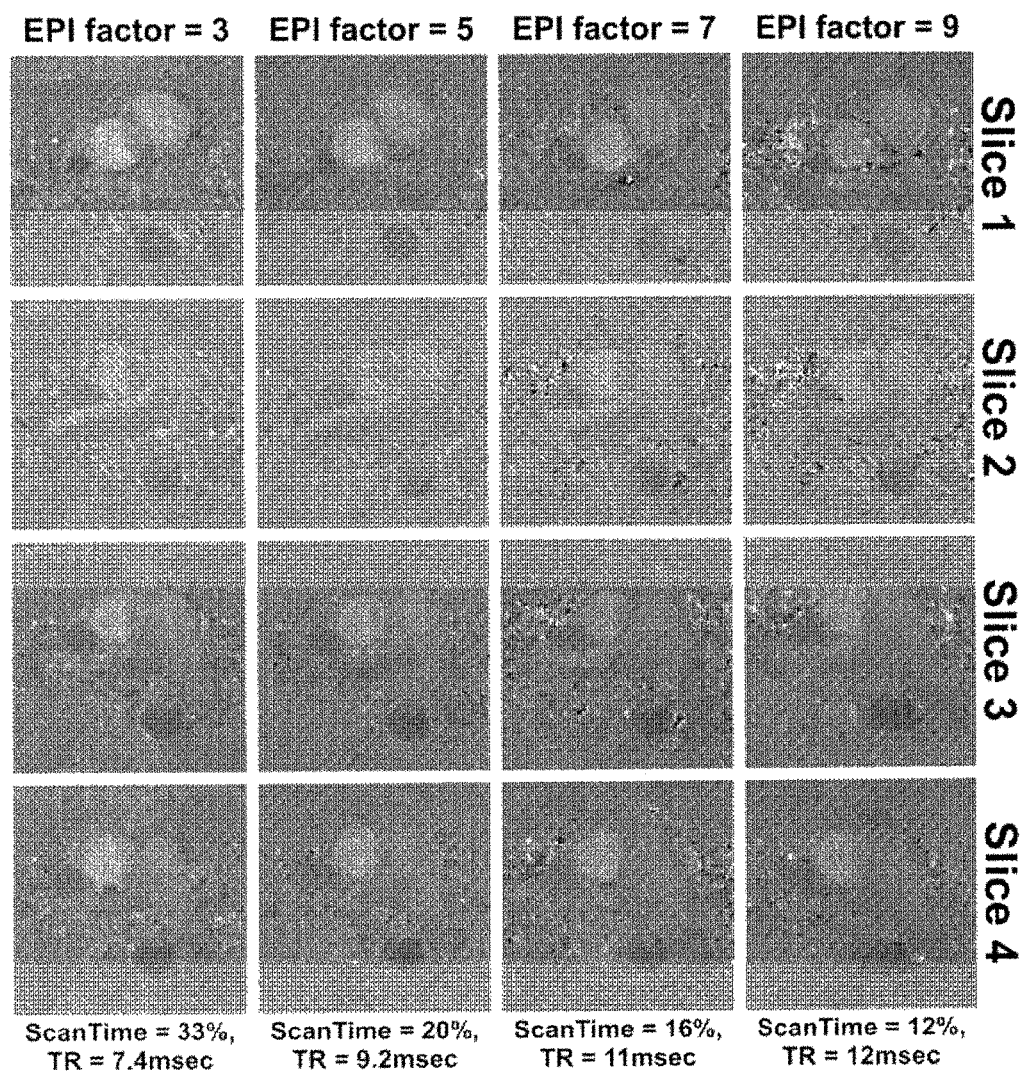
Figure 4:
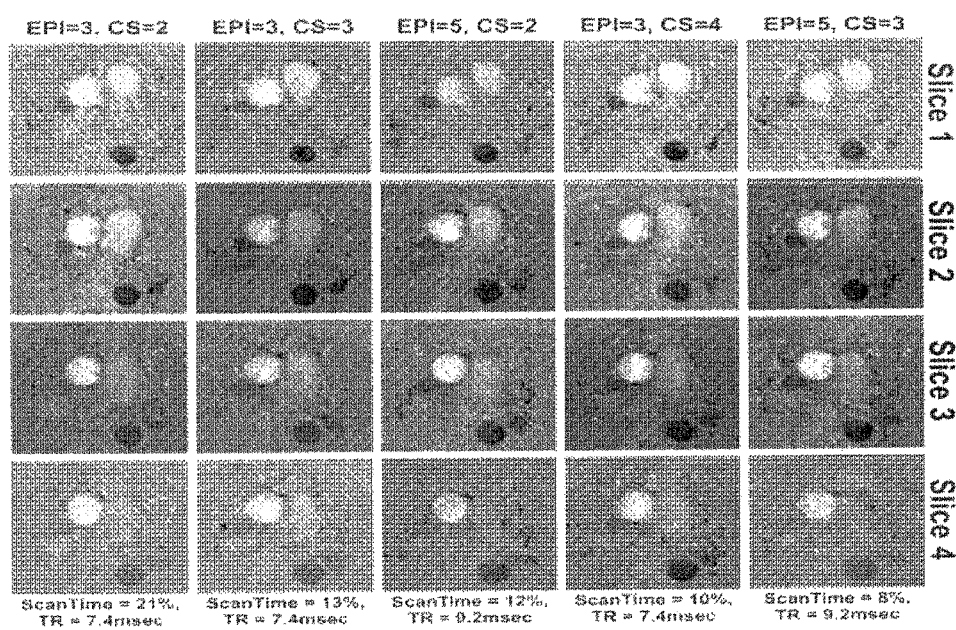
Figure 5:
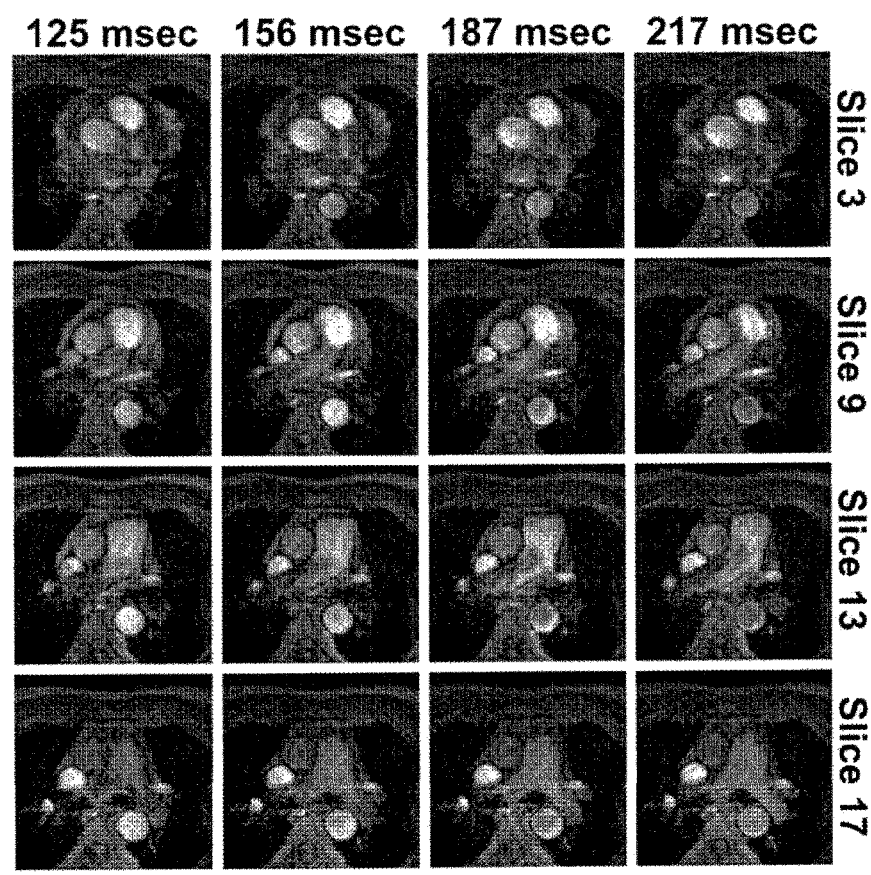
Figure 6:
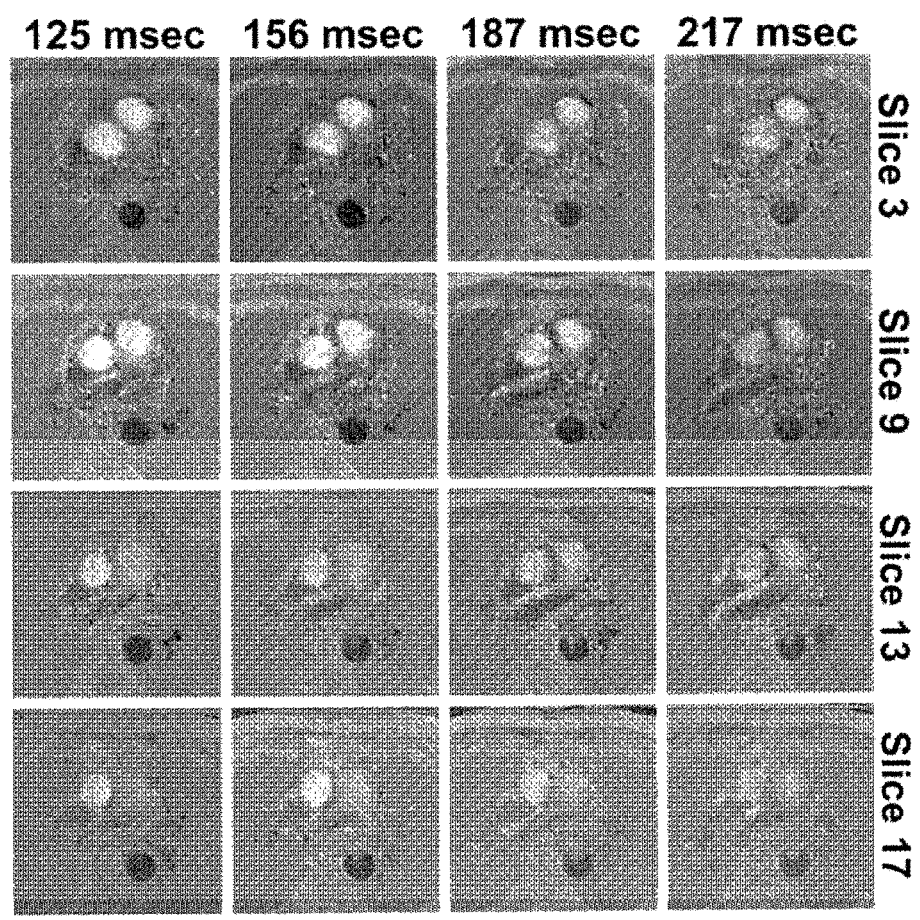
Figure 7:
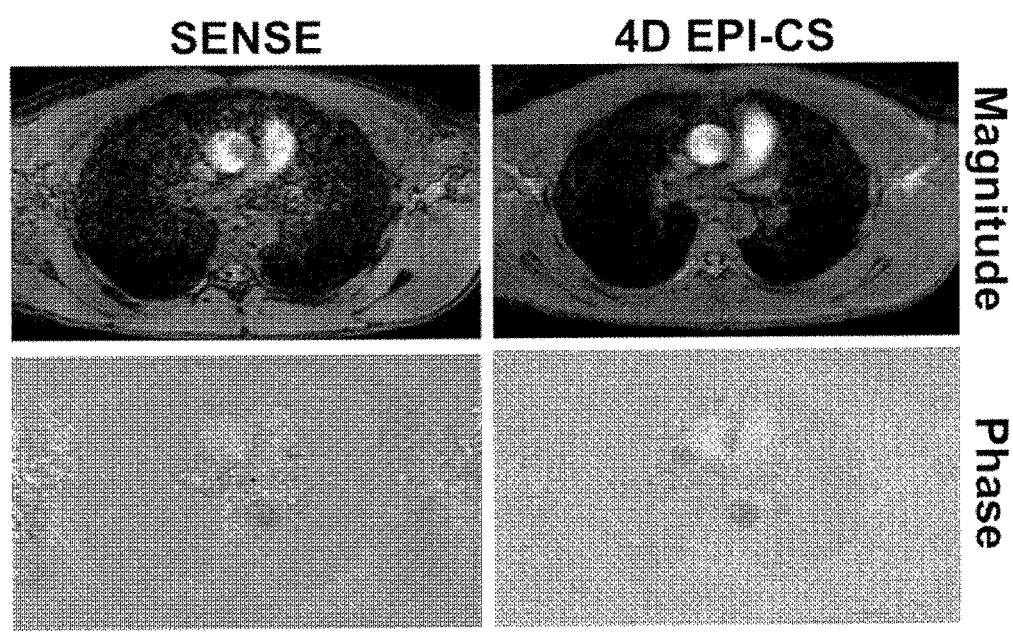
Figure 8:
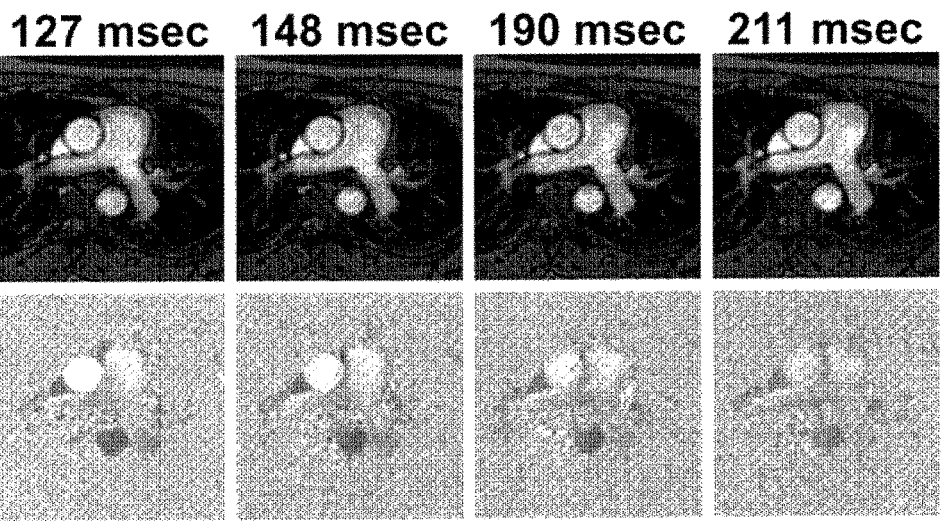
Figure 8:
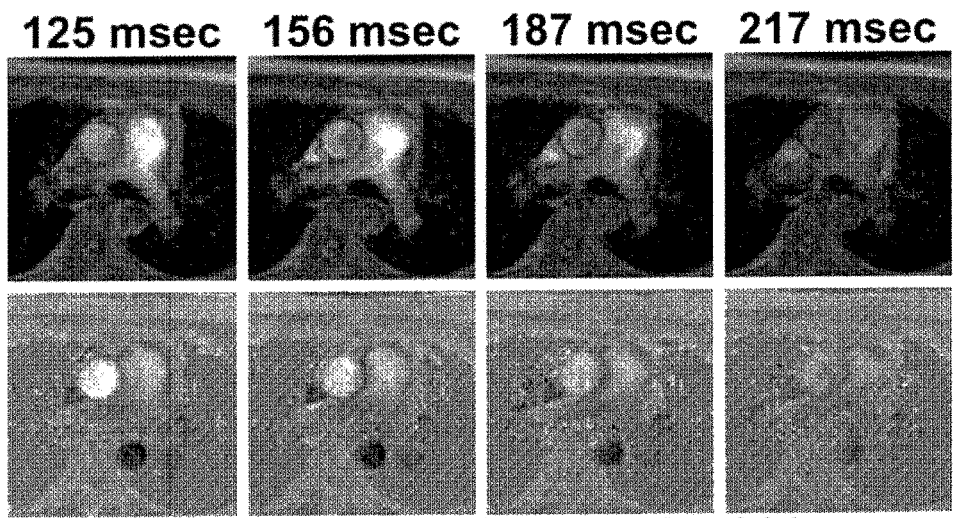
Figure 9:
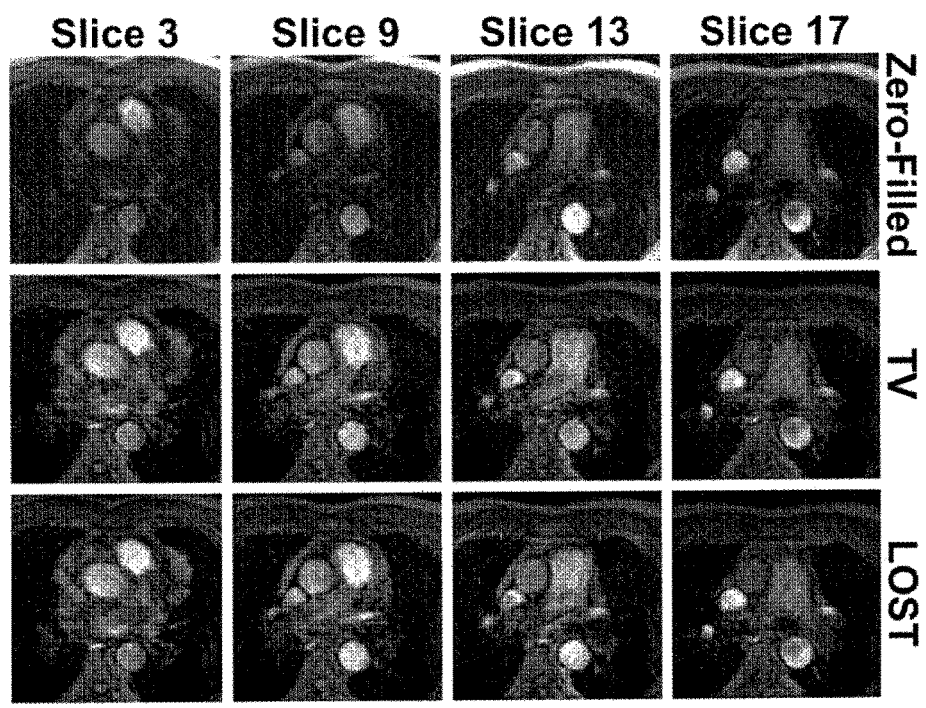
Figure 10:
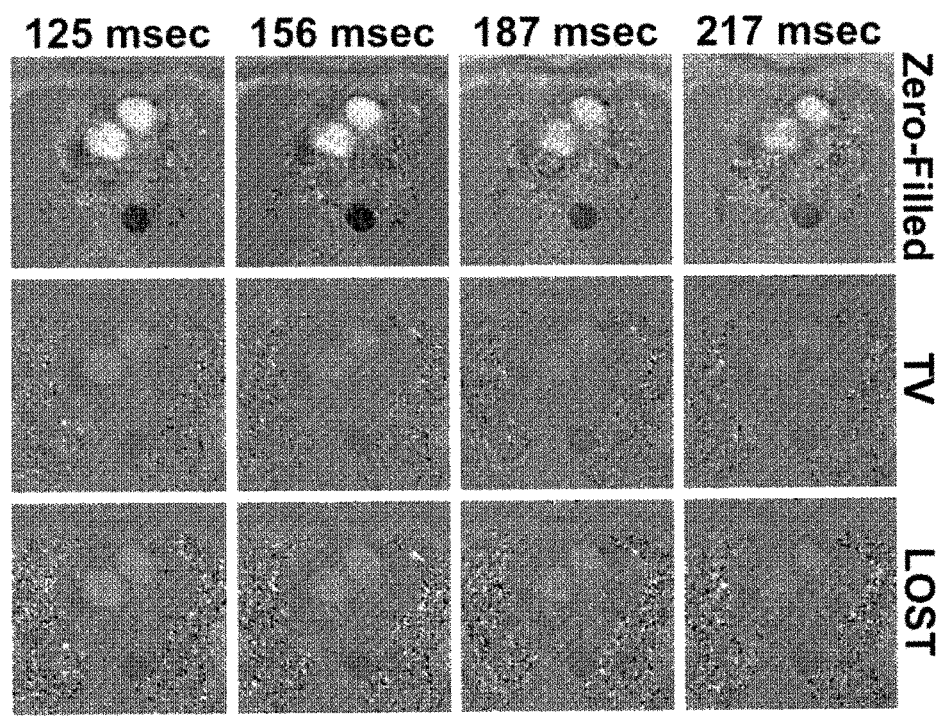
Figure 11:
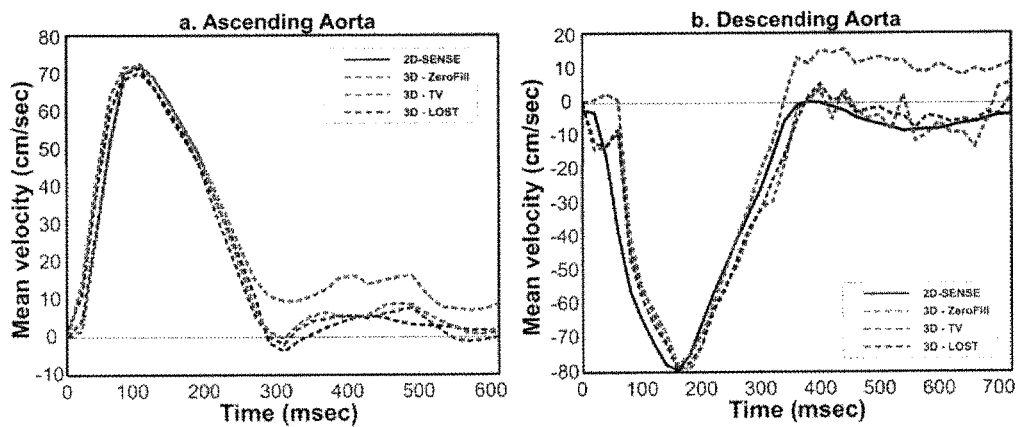
Figure 12:
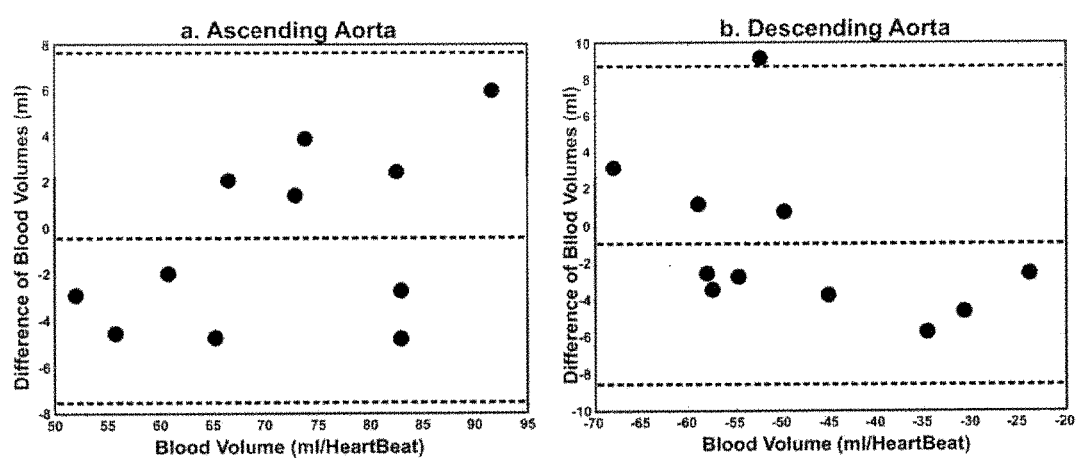
Figure 13:
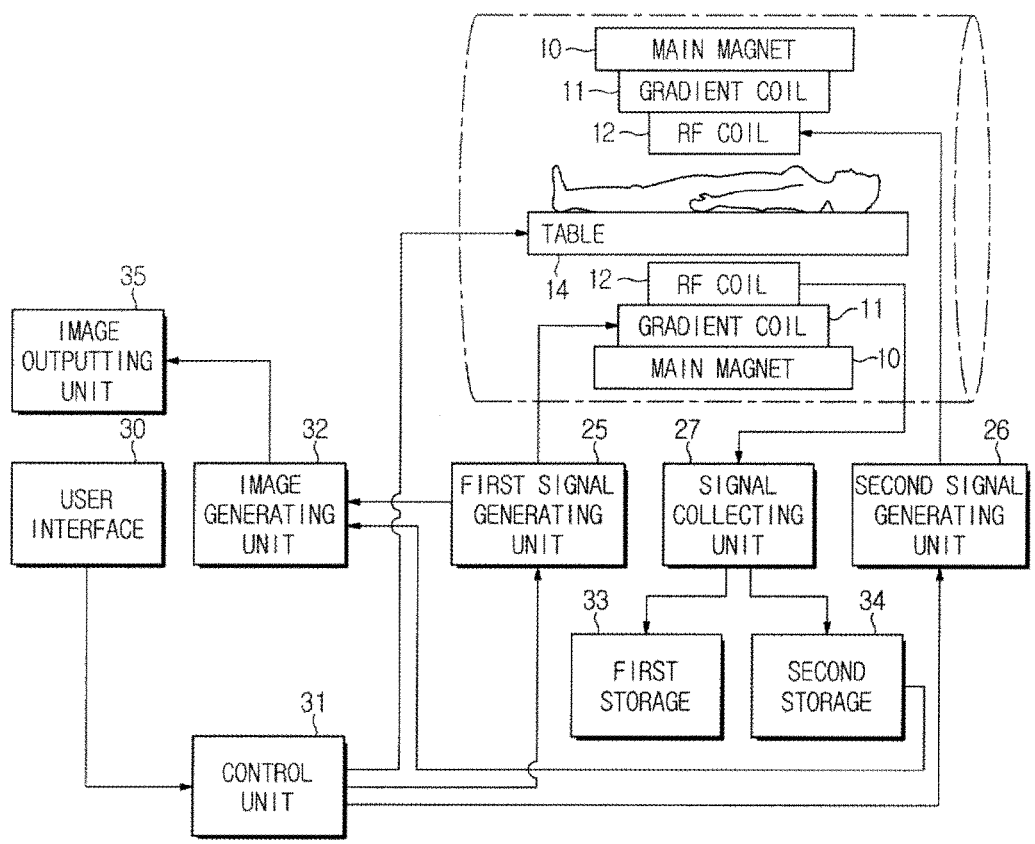
Figure 14:
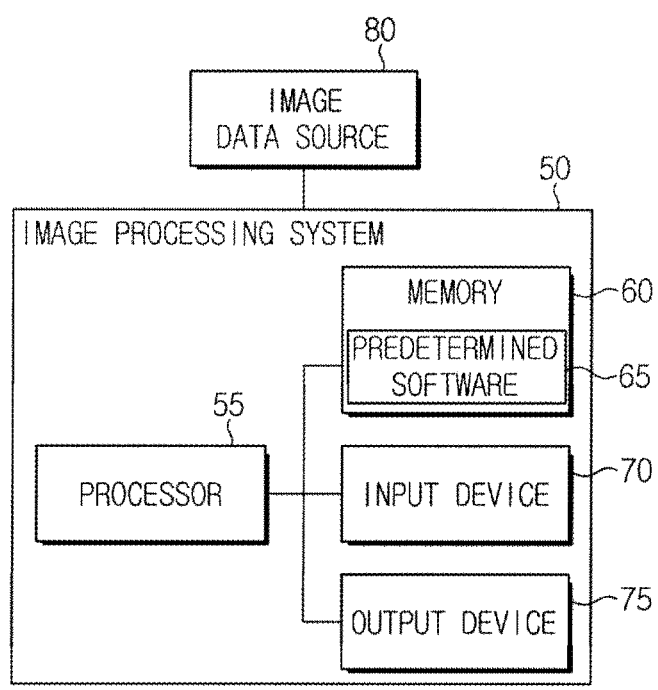

EPI readout and a ky-kz map for the randomly under-sampled k-space;

FIG. 2 is a K-space acquisition strategy showing: (a) radial ordering, (b) fashion in the ky-kz plane, (c) dividing the k-space into multiple segments, (d) radial ordering, where the k-space profiles are randomly undersampled and acquired in a radial fashion, (e) EPI and constrained reconstruction combined into one acquisition with a higher acceleration rate;

FIG. 3 are examples of phase images for four different acquisitions using EPI factors of 3, 5, 7 and 9;

FIG. 4 is an example of magnitude and phase contrast images acquired using an EPI factor of 5 with a constrained reconstruction rate of 1 (left two columns) and 3 (right two columns);

FIG. 5 is an example of magnitude images for various slices and cardiac phases (specified by time after the R wave) of 3D PC MRI acquisitions from a subject with a heart rate of 75 bpm, acquired using the proposed dynamic imaging-EPI-constrained reconstruction sequence;

FIG. 6 are examples of phase images for various slices and cardiac phases (specified by time after the R wave) of 3D PC MRI acquisitions from the same subject;

FIG. 7 is an example of magnitude and phase images from two different 3D scans, using standard SENSE with overall rate 4 (2 in each phase encoding direction) and the proposed 3D-EPI-constrained reconstruction;

FIG. 8 shows representative frames of magnitude and phase images acquired using the standard 2D and the proposed 3D acquisitions with an EPI factor of 3 with CS rate of 3;

FIG. 9 is an example of magnitude images when different reconstruction methods (zero-fill, TV, and LOST) are applied on the images in FIG. 6;

FIG. 10 is an example of phase images when different reconstruction methods (zero-fill, TV, and LOST) are applied on one of the slices in FIGS. 6 and 10 (specifically slice 3);

FIG. 11 is a diagraming showing a representative mean of ascending aorta velocities from both 2D and 3D acquisitions, and using different reconstruction methods for the undersampled 3D data;

FIG. 12 are Bland-Altman plots for blood volume rates in both ascending and descending aorta, and measured from 2D and 3D-EPI-CS sequences;

FIG. 13 shows an exemplary embodiment of an image processing system according to the present claims that is configured to perform the image processing; and FIG. 14 shows one non-limiting embodiment of an image processing system according to the present claims.

DETAILED DESCRIPTION

Hereinafter, aspects of the present invention will be described with reference to the accompanying drawings. In the following description, a detailed explanation of known related functions and constructions may be omitted to avoid unnecessarily obscuring an artisan's appreciation of the subject matter of the present invention with explanations of known functions. This invention may, however, be embodied in many different forms and should not be construed as limited to the exemplary embodiments set forth herein. The same reference numbers are used throughout the drawings to refer to the same or like parts.

Also, terms described herein, which are defined considering the functions of the present invention, may be implemented differently depending on the user and operator's intentions and practices. Therefore, the terms should be understood on the basis of the disclosure throughout the specification. The principles and features of this invention may be employed in varied and numerous embodiments without departing from the scope of the invention.

Furthermore, although the drawings represent exemplary embodiments of the invention, the drawings are not necessarily drawn to scale and certain features may be exaggerated or omitted in order to better illustrate and/or explain the present invention with better clarity.

Throughout the disclosure and appended claims the term "k-space" is a term used to describe a data acquisition matrix in an MRI, in which the k-space contains raw image data prior to undergoing image processing.

In addition, throughout the disclosure and appended claims, the term "under-sampled k-space" indicates that the Nyquist criterion is not satisfied, at least in some regions of k-space. "Fully sampled k-space" indicates that the Nyquist criterion is satisfied.

In a first aspect, a novel method in which Echo Planar Imaging (EPI) is used for acquisition and then combined with constrained reconstruction techniques for randomly undersampled k-space sampling. In fact, when the EPI is combined with an undersampled 3D k-space sampling sequence using a LOw-dimensional-structure Self-learning and Thresholding (LOST) reconstruction (as disclosed in U.S. Pat. No. 8,699,773, commonly owned and assigned as this application at the time of filing of this application), in which constrained reconstruction is used so that an image of the subject is reconstructed from an acquired undersampled image, and is used to guide further image reconstruction.

Figure 1A:
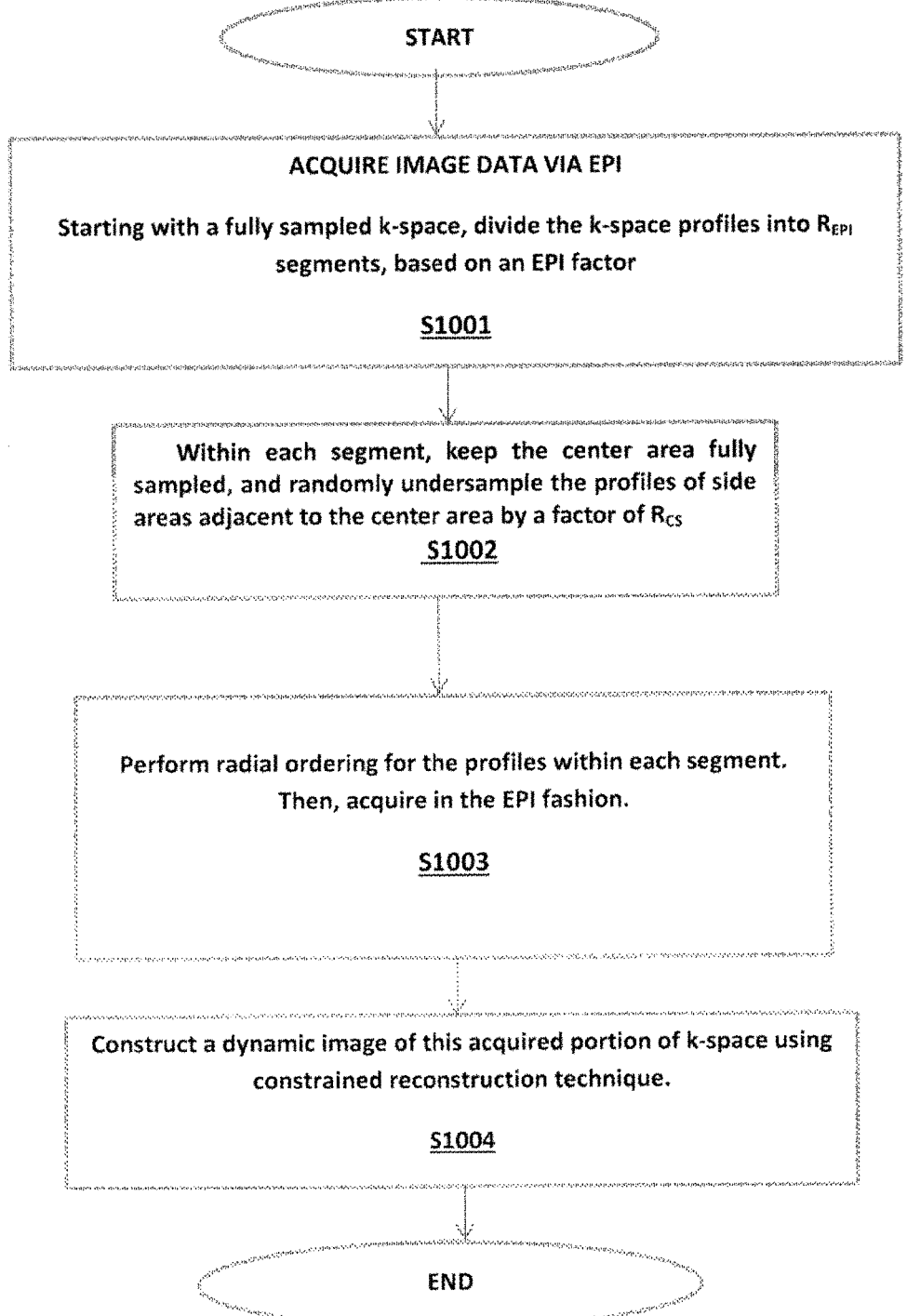
FIG. 1A is a flowchart providing a basic overview of a method according to the present claims.

FIG. 1A is a flowchart providing a basic overview of a method according to the present claims. As shown in FIG. 1A, at S1001 there is an acquisition of image data via EPI. There is a full sampling of k-space with regard to a center, and random undersampling k-space profiles of side segments. Starting with a fully sampled k-space, the k-space profiles are divided into $R_{EPI}$ segments, based on an EPI factor At S1002, within each segment, keeping the center area fully sampled, and randomly undersample the profiles of side areas adjacent to the center area by a factor of $R_{CS}$.

At S1003, radial ordering is performed with the constrained reconstruction technique while randomly undersampling the side segments.

At S1004, a dynamic image is constructed of at least a portion of the k-space based on a combined EPI and randomly undersampled constrained reconstruction techniques. For example a "LOST" reconstruction technique as discussed in detail herein below, or any type of constrained reconstruction that randomly undersamples y-z domains.

In a typical clinical flow sequence do not normally have eddy current problems, However our speeding up of the sequence by Undersampling the k-space causes the problem of eddy currents start to appear, and we address this problem by using the radial profile order to reduce this side effect.

During a multi-shot acquisition, the undersampling of the k-space results in non-uniform jumps in the k-space, which is associated with large gradient switching resulting in eddy current artifacts especially with SSFP sequence. A special radial profile ordering was proposed to reduce this effect. The radial ordering profile is combined with the EPI acquisition strategy. FIG. 2 shows how this combination was performed. Starting from a regular linear ordering (FIG. 2a), EPI method divides the k-space profiles into $R_{EPI}$ segments, based on the EPI factor, then one k-space line of each segment (i.e. $R_{EPI}$ lines) are acquired in the same cardiac cycle. This leads to an approximate reduction rate of $R_{EPI}$ (FIG. 2(c)).

The data acquisition is based on an EPI acquisition with a radial profile ordering (FIG. 2(b)), while randomly undersampling the profiles by factor of $R_{CS}$ and keeping the k-space center fully sampled (FIG. 2(d)). To combine both methods, we squeeze down the whole radial ordering mechanism into each EPI segment (i.e. the profiles are acquired simultaneously in EPI linear segments, but sorted in a radial fashion inside each segment) as shown in (FIG. 2(e)). This leads to an approximate reduction rate of $R_{EPI} \times R_{CS}$.

Lost Reconstruction

Raw k-space data of the EPI-constrained reconstruction PC-MRI scans can be exported to perform off-line reconstruction. Two non-limiting different reconstruction algorithms that could be used include total variation (TV) constrained reconstruction, and Low-dimensional-structural self-learning and thresholding (LOST) method for estimating the missing k-space lines for the randomly undersampled datasets.

With respect to LOST reconstruction, in general a low resolution image is used from a substantially fully-sampled portion of image data, for example, the central portion of k-space, wherein blocks with similar characteristics, are arranged into similarity clusters, and the similarity clusters are the processed for de-aliasing and artifact removal through the use of underlying low-dimensional properties. In one non-limiting example, the similarity clusters can be arranged into a three-dimensional structure and processed using, for example, a 3D Fourier transform (or other transforms such as a wavelet transform), and/or combinations of more than one transform, in which case each transform may be performed on one or more dimensions, so as to yield high levels of sparsity due to the similarity of the image blocks.

Alternatively, each image block in a similarity cluster can be vectorized and arranged into a matrix with low-ranking properties. Each of the similarity clusters is likely to fit a low-dimensional signal model, thereby allowing artifacts due to undersampling and noise to be represented as perturbations to the low-dimensional structure. Such a characteristic facilities further processing, and preserving information, and similarity clusters can be non-linearly thresholded based on low-dimensional properties to remove the perturbations.

Figure 1B:
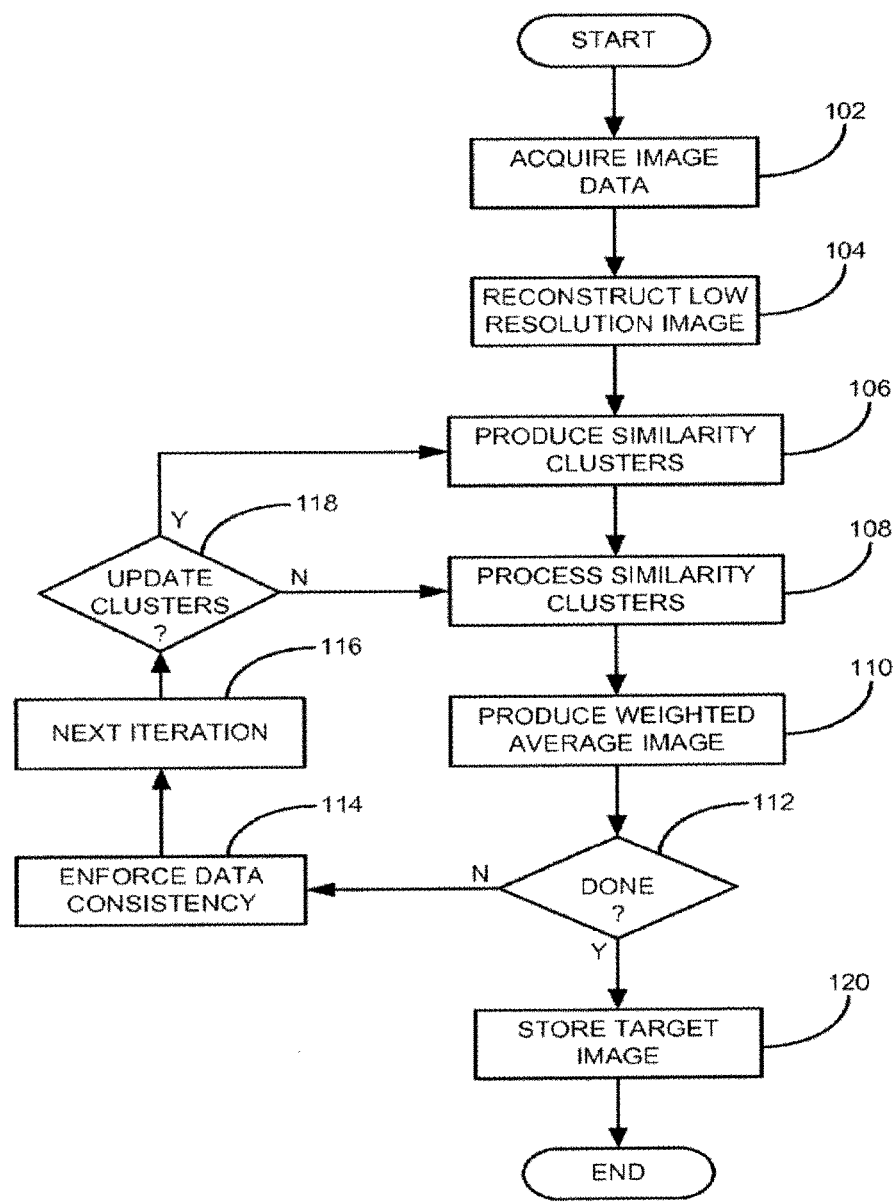
FIG. 1B is a prior art flowchart showing an exemplary operation of a LOST reconstruction that can be used in the present claims.

FIG. 1B is a prior art flowchart providing an algorithm for operation of the LOST reconstruction, such as described above and in U.S. Pat. No. 8,699,773, commonly owned and assigned. While U.S. Pat. No. 8,699,773 is incorporated by reference in its entirety as background material, herein the next two paragraphs and FIG. 1 of U.S. Pat. No. 8,699,773 are provided. The LOST method includes an acquisition of data consistent with the Nyquist criterion at the center of the image, and inconsistent with the Nyquist criterion at peripheral portions of the image, where higher frequencies are located.

With regard to FIG. 1B, after EPI acquisition as discussed by the present inventors, then a constrained reconstruction of images can be performed using a low-dimensional-structure self-learning and thresholding ("LOST") method. As indicated at step 102 there is an acquisition of image data, and the acquisition may sample data consistent with the Nyquist criterion, or may undersample data in violation of the Nyquist criterion. When the data acquisition results in undersampled image data, it is beneficial that sufficient data be acquired to produce a substantially artifact-free, low-resolution image of the object being imaged. For example, when magnetic resonance imaging is used for acquiring under-sampled image data, it is beneficial that the data acquisition sample a central portion of k-space in agreement with the Nyquist criterion, while undersampling the peripheral portions of k-space in which higher spatial frequencies are located.

After the image data has been acquired, as indicated at step 104, there is a reconstruction of a low resolution image from the image data. The image reconstruction may include the application of a Hann function to window the image data before performing a Fourier transform-based image reconstruction. The application of the Hann function results in an image with low aliasing artifacts, but a decrease in spatial resolution. From this low resolution image, as indicated at step 106, a plurality of similarity clusters are produced. Such similarity clusters include image blocks that contain similar information, such as anatomical content in medical imaging applications.

In other words, with reference to the above two paragraphs, the center of the image (a center segment) is fully sampled, while the periphery is under-sampled. The center segment that is fully sampled can be the size of about 15-20% of the image and the remainder of the image is under sampled. It is to be understood that any type of image reconstruction that is undersampled, for example the Y-Z domain, can be used instead of the LOST image reconstruction. At S108, the similarity clusters are processed so as to remove artifacts, and may be based on transfer domain characteristics and low-rank characteristics. At S110, the processed similarity clusters are combined to form a final image estimate based on a weighted approach that may give smaller weights to noisier or aliased locks. At S112, a decision is made as to whether the weighted average image satisfies a stopping criterion for the image reconstruction. If the criterion is satisfied, there is storage as a target image S120, or at S114 a data consistency condition is enforced, for example, by forward projecting the image estimate into image estimate data that is compared with the acquired image data, and can be averaged to produce updated image data. Then, at S116 a next iteration of the reconstruction is selected and a decision made at block 118 whether or not to update the similarity clusters before processing again.

Figure 1C:
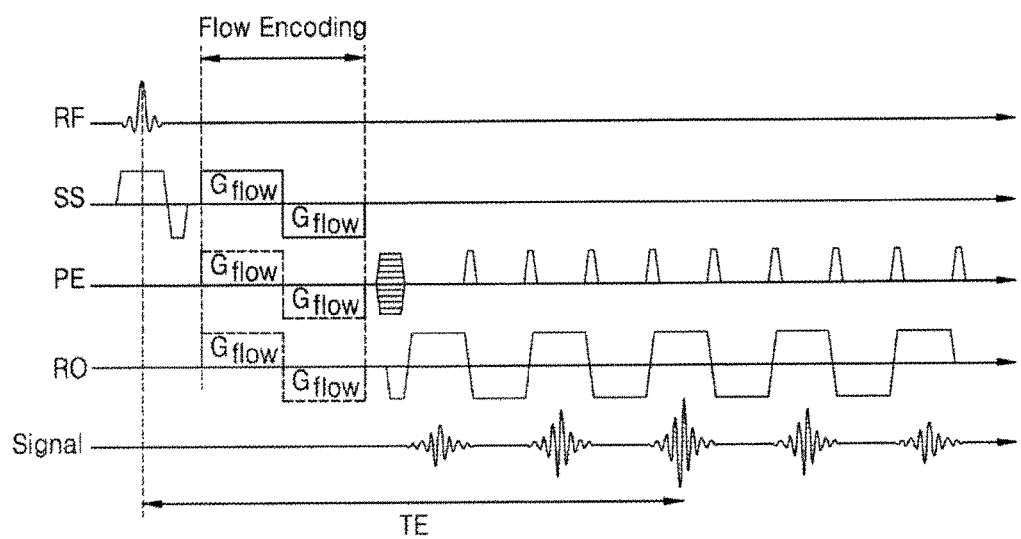
Figure 1C:
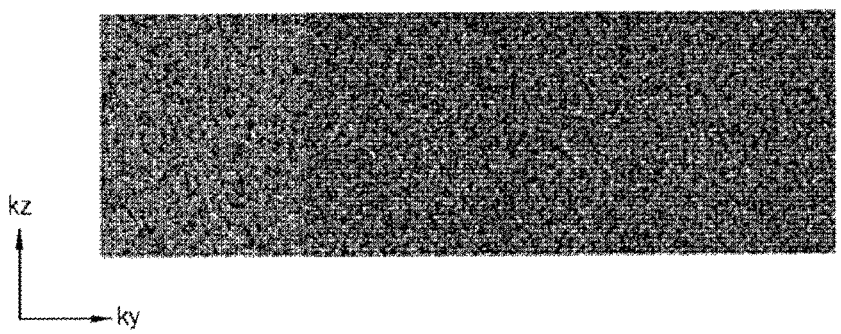

FIG. 1C shows a pulse sequence diagram for the PC sequence with an EPI readout. A bipolar gradient is added to the gradient axis for which the flow direction is encoded. This is followed by conventional EPI readout. Item (b) shows ky-kz map for the randomly undersampled k-space. Each dot in this map represents a line in k-space (i.e. one readout profile). The white dots represent the acquired lines while the black dots represent the non-acquired line. All the images shown herein were exported into a separate station for quantitative analysis to evaluate the proposed pulse sequence acquisition and reconstruction. However, the claimed invention is not limited by such an arrangement. For each subject, two acquisitions were mainly evaluated: a) the breath-hold 2D flow acquisition, and b) the proposed undersampled 3D acquisition after reconstruction. First, given the 2D scan, the closest matching slice in the 3D scan was visually selected. Second, for each slice, a region-of-interest (ROI) was manually drawn on the ascending and descending aorta across different time frames (i.e. cardiac phases) using the magnitude images in each set. The ROIs were manually corrected throughout the cardiac cycle for cardiac motion. The stroke volume and the mean velocity curve for the blood flow were calculated for each acquisition. All statistical analyses were performed using Matlab (v7.14, The MathWorks, Natick, Mass.) and SPSS (v20.0, SPSS Inc, Chicago, Ill.). To assess the similarity of the measurements, a linear model analysis was used for all the measurement parameters, including stroke volume, mean velocity in the ascending and the descending aorta. In order to capture the measurements variability within and between-subject, the data from the 2D sequence for all subjects were structured into one single vector with an indicator variable for time within subject. The data from the 3D sequence were structured the same way. The overall slope between these two vectors, as well as the 95% confidence intervals, was computed taking into account the correlation of the measurements within each subject. The measurements were considered to be equivalent if the confidence interval covered 1.0. The correlation (variance-covariance) structure was assumed to be compound symmetry which yielded the within and between-subject variance components which were used in the estimation of the difference and confidence interval via a linear mixed-effects model. This comparison test was repeated for each reconstruction method used for reconstructing the undersampled 3D volume (i.e. simple zero-filling, CS-TV, and LOST). Bland-Altman analyses were then performed to compare the stroke volume values of between the 2D scans and the corresponding slices in the 3D-EPI-CS scans.

FIG. 2 shows K-space acquisition strategy: With conventional 3D imaging, the profiles are spanned/acquired in either a linear (a) or radial ordering (b) fashion in the ky-kz plane. Based on the linear ordering strategy, EPI acceleration (c) divides the k-space into multiple segments, where one line from each segment is acquired within the same EPI shot. In contrast, constrained reconstruction acceleration (d) is primarily based on radial ordering, where the k-space profiles are randomly undersampled and acquired in a radial fashion while keeping the center area of the k-space fully sampled. Both EPI and constrained reconstruction can be combined into one acquisition with a higher acceleration rate as shown in (e). While the k-space is divided into multiple segments, each segment is randomly undersampled with the same pattern and then acquired in a radial fashion. The major advantage is the high overall acceleration rate (9 in this example) for the whole 3D acquisition, while one drawback is the necessity to fully sample parts of the k-space even if it is not at the center of the k-space.

FIG. 3 is an example of phase images for four different acquisitions using EPI factors of 3, 5, 7 and 9. Each column represents a separate scan with different EPI factor, while each row represents a specific slice at the same time frame from the 3D acquisitions. Slices and time frames are visually chosen to have approximately the same location in 3D, and the same phase of the cardiac cycle. It can be seen that images acquired with EPI factor of 3 and 5 show reasonable image quality. However, field homogeneity and temporal smoothing artifacts show up clearly for higher EPI factors (i.e. 7 and 9).

FIG. 4 shows examples of magnitude and phase contrast images acquired using an EPI factor of 5 with constrained reconstruction rate of 1 (left two columns) and 3 (right two columns).

FIG. 5 shows examples of magnitude images for various slices and cardiac phases (specified by time after the R wave) of 3D PC MRI acquisitions from a subject with a heart rate of 75 bpm, acquired using the proposed 4D-EPI-constrained reconstruction sequence, depicting cross-sections across the descending aorta and ascending aorta. FIG. 6 shows an example of phase images for various slices and cardiac phases (specified by time after the R wave) of 3D PC MRI acquisitions from the same subject of FIG. 6. The flow patterns through the ascending and the descending aorta are shown, and are not hindered by the relatively high acceleration rate applied during the scan (≈7). It should be noted that while the SNR is inherently low, the phase information and structure are well preserved in the 3D acquisition despite the relatively high acceleration rate.

FIG. 7 shows an example of magnitude and phase images from two different 3D scans, using standard SENSE with overall rate of 4 (2 in each phase encoding direction) and the proposed 3D-EPI-Constrained Reconstruction. Scan time was 8:20 minutes for the SENSE scan, and 3:24 minutes for the 3D-EPI-Constrained reconstruction scan. Despite the longer scan time, the deterioration in the SENSE image quality can easily be seen, as the image quality of both magnitude and phase has significantly deteriorated. However, the proposed sequence suffers only from aliasing and smoothing of artifacts.

FIG. 8 shows representative frames of magnitude and phase images acquired using the standard 2D and the proposed 3D acquisitions with an EPI factor of 3 with a constrained reconstruction rate of 3. The representative slice for the 3D scan was visually selected to match the slice in the 2D scan. Due to the different temporal resolution between the two scans (21 msec for the 2D scan and 30 ms for the 3D scan), the time frames cannot be perfectly aligned. So selection of the closest time frame when needed, is the best way to proceed.

FIG. 9 shows examples of magnitude images when different reconstruction methods (zero-fill, TV (total variation), and LOST) are applied on the images in FIG. 6. The images details look sharper and clearer with both TV and LOST methods.

FIG. 10 shows an example of phase images when different reconstruction methods (zero-fill, TV, and LOST) are applied on one of the slices in FIGS. 6 and 10 (specifically slice 3). The flow patterns look more homogenous and less noisy in the TV and LOST methods in both the ascending and descending aorta.

FIG. 11 shows a representative mean of ascending aorta velocities from both 2D and 3D acquisitions, and using different reconstruction methods for the undersampled 3D data. Note the shifts between the curves pointed by the arrows. More particularly, FIG. 11 shows a flow curve of the mean velocity of the blood flow 2D and dynamic imaging such as 4D-EPI-CS PC-MRI using simple zero filling, CS-TV, and LOST techniques. It should be noted that the curves measured from the reconstructed phased images in either TV or LOST, are close to values of the 2D curve, but also show more fluctuation around these values.

FIG. 12 shows Bland-Altman plots for blood volume rates in both ascending and descending aorta, and measured from 2D and 3D-EPI-constrained reconstruction sequences. The blood volume rate in the ascending aorta is usually regarded as the stroke volume.

Hereinafter, FIG. 13 shows a basic exemplary layout of an MRI apparatus that is configured to perform a method for reducing scan time in dynamic magnetic resonance (MR) imaging such as dynamic contrast enhanced or phase contrast MRI associated with at least a portion a k-space according to the present claims.

Moreover, FIG. 13 is a view illustrating a structure of a magnetic resonance imaging (MRI) apparatus or system according to an exemplary embodiment of the present invention for reducing scan time in dynamic magnetic resonance (MR) imaging such as dynamic contrast enhanced or phase contrast MRI associated with at least a portion a k-space. It is to be understood that this is only an example of one way the hardware may be structured, and that the claimed invention is not limited to the example depicted herein.

Referring now to FIG. 13, the MRI apparatus typically includes a main magnet 1, a gradient coil 11, a radio frequency (RF) coil 12, a shield 1, a table 14, a first signal generating unit 25, a second signal generating unit 26, a signal collecting unit 27, a user interface 30, a control unit 31, an image generating unit 32, a first storage 33, a second storage 34, and an image outputting unit 35.

The main magnet 10, the gradient coil 11, and the RF coil 12 are elements for generating a magnetic field to induce magnetic resonance signals from atomic nuclei inside a human body, and may be implemented as a magnet, coils, etc. The shield 13 blocks an electromagnetic wave generated by the RF coil 12 from being radiated to the outside. A target object, for example, a patient, lies on the table 14 inside the shield 13, and the table 14 may move by control of the control unit 31 in or out of the assembly of components 10-13, to position the patient for MRI photography.

The first signal generating unit 25, the second signal generating unit 26, and the signal collecting unit 27 are components for transmitting signals to generate the magnetic field in the gradient coil 11 and the RF coil 12 by the control of the control unit 31, or for collecting signals received in the RF coil 12 and providing the image generating unit 32 with the collected signals, and may be implemented as an oscillator, an amplifier, a modulator, a demodulator, an analog-to-digital converter (ADC), a digital-to-analog converter (DAC), etc. The user interface 30, the control unit 31, the image generating unit 32, the first storage 33, the second storage 34, and the image outputting unit 35 are components for controlling the first signal generating unit 25 and the second signal generating unit 25, or for processing signals collected by the signal collecting unit 27, and may be implemented as a computer and peripheral devices of the computer.

The main magnet 10 generates a static magnetic field for arranging directions of magnetic dipole moments of atomic nuclei, typically hydrogen nuclei in water molecules, inside the human body in one direction. Examples of the main magnet 10 for generating the static magnetic field include a permanent magnet, a room temperature electromagnet, a superconductivity electromagnet, etc. A magnetic field generated by the superconductivity electromagnet is strong and uniform, and thus the superconductivity electromagnet is mainly used as the main magnet 10. For example, if hydrogen atomic nuclei inside the human body are placed in the static magnetic field generated by the main magnet 10, directions of magnetic dipole moments of the hydrogen atomic nuclei are arranged in a direction of the static magnetic field generated by the main magnet 10 in order to go into a lower energy state. To maintain a thermal parallel state, the number of atomic nuclei in a low energy state is actually slightly greater than the number of atomic nuclei in a high energy state. In this regard, an energy difference between atomic nuclei in different energy states is proportional to an intensity of the static magnetic field generated by the main magnet 10, and has an intrinsic Larmor frequency associated with Larmor precession of the atomic nuclei. For example, if the intensity of the static magnetic field generated by the main magnet 10 is 1 Tesla, the Larmor frequency of a hydrogen atomic nucleus in the static magnetic field generated by the main magnet 10 is 42.58 MHz, and the Larmor frequency of a sodium atomic nucleus therein is 11.27 MHz.

The gradient coil 11 generates a gradient magnetic field that varies at a constant gradient with respect to each of a plurality of directions, for example, directions x, y, and z, in proportion to a distance from a reference location within the static magnetic field generated by the main magnet 10. In this regard, the reference location may be an origin point of a 3D coordinate system when a space including a static magnetic field generated by the main magnet 10 is presented as the 3D coordinate system. Each of the magnetic resonance signals received by the RF coil 12 has location information in a 3D space due to the gradient magnetic field generated by the gradient coil 11. The gradient coil 11 may comprise an X gradient coil for generating the gradient magnetic field that varies in the direction x, a Y gradient coil for generating the gradient magnetic field that varies in the direction y, and a Z gradient coil for generating the gradient magnetic field that varies in the direction z.

The RF coil 12 generates an electromagnetic wave signal having an RF corresponding to a type of an atomic nucleus, i.e., an RF signal, and applies the electromagnetic wave signal to the target object in order to transit the atomic nucleus from the low energy state to the high energy state. Atomic nuclei inside the target object are excited by the applied electromagnetic wave signal. In this regard, the target object is generally an MR image captured site of the human body, or may be a living body other than the human body or an inanimate object.

For example, the RF coil 12 may generate the electromagnetic wave of 42.58 MHz to transit an energy state of the hydrogen atomic nucleus within the static magnetic field of 1 Tesla. Also, the RF coil 12 may generate the electromagnetic wave of 11.27 MHz to transit an energy state of the sodium atomic nucleus within the static magnetic field of 1 Tesla. If the electromagnetic wave signal generated by the RF coil 12 is applied to an atomic nucleus, the atomic nucleus is transited from a low energy state to a high energy state. Thereafter, if the electromagnetic wave signal generated by the RF coil 13 disappears, i.e. if the electromagnetic wave applied to the atomic nucleus disappears, the atomic nucleus radiates an electromagnetic wave having the same Larmor frequency while being transited from the high energy state to the low energy state.

The RF coil 12 receives an electromagnetic wave signal radiated from atomic nuclei inside the target object. The electromagnetic wave signal is referred to as a free induction decay (FID) signal. The FID signal is referred to as an echo signal with respect to the electromagnetic wave signal applied to the target object as a magnetic resonance signal used to generate a magnetic resonance image. A length of a time interval from a time point when the electromagnetic wave signal is applied to the target object, i.e. a time point when the electromagnetic wave signal is generated, to a time point when the electromagnetic wave signal is received from the target object is referred to as an echo time (TE). A length of a time interval when an application of the electromagnetic wave signal to the human body repeats is referred to as a repetition time (TR).

The RF coil 12 may be implemented as one coil having a function of generating an electromagnetic wave having an RF corresponding to a type of an atomic nucleus and a function of receiving an electromagnetic wave radiated from the atomic nucleus, or may be implemented as a transmission coil having the function of generating the electromagnetic wave having the RF corresponding to the type of the atomic nucleus and a reception coil having the function of receiving the electromagnetic wave radiated from the atomic nucleus. In particular, according to the present embodiment of FIG. 13, the reception coil of the RF coil 12 may be implemented as a dual tuned coil capable of receiving several frequencies in one coil, may be implemented as a multi-channel coil capable of simultaneously receiving a plurality of magnetic resonance signals, or may be implemented as a dual tuned multi-channel coil.

The user interface 30, which includes circuitry such as sensors, processors and microprocessors configured for operation, receives a command from an operator of the MRI apparatus of FIG. 13 and outputs the command to the control unit 31. The user interface 30 may be implemented as a general input device of a computer, such as a keyboard and a mouse. The image outputting unit 35 which includes circuitry such as sensors, processors and microprocessors configured for operation, and display that is preferably a thin film technology (TFT) but is not limited thereto, outputs the magnetic resonance image generated by the image generating unit 32. The image generation unit 32 which includes circuitry such as sensor, processors and microprocessors configured for operation, may preferably contain a graphics processing unit (GPU) that is configured for operation to perform the methods described herein above, and while in the above examples in the specification a NVIDIA GeForce GTX 480 hardware was used, where all GPU operations were implemented using the CUDA platform, the invention is not limited thereto, as other hardware can be configured that equivalents or successors of the hardware discussed herein, as various types of hardware may be used for image reconstruction. The image outputting unit 35 may be implemented as a general output device of the computer such as a monitor. The control unit 31, which includes circuitry such as a processor or microprocessor configured for operation, controls the first signal generating unit 25, the second signal generating unit 26, the signal collecting unit 27, and the image generating unit 32 according to the command output from the user interface 30. The image generating unit 32 generates a magnetic resonance image by using magnetic resonance signals that are collected by the signal collecting unit 27 and are stored in the first storage 33 and the second storage 34. The control unit 31 and the image generating unit 32 may be implemented as a high performance special purpose computer capable of promptly processing a large amount of data required to generate the magnetic resonance image. Meanwhile, it will be understood by one of ordinary skill in the art that the terms "generating the magnetic resonance image" may be replaced by various terms such as "reconstructing the magnetic resonance image".

The control unit 31, which as discussed before includes circuitry such as processors and microprocessors configured for operation, generates a control signal indicating an alternating signal having a frequency varying at a certain gradient with respect to each of the directions x, y, and z, and outputs the control signal to the second signal generating unit 26. The first signal generating unit 25 generates the alternating signal having a frequency varying at a constant gradient with respect to each of the directions x, y, and z according to the control signal received from the control unit 31, and outputs the alternating signal to the gradient coil 11. The gradient coil 11 generates a gradient magnetic field that varies at a constant gradient with respect to each of the directions x, y, and z according to the alternating signal received from the first signal generating unit 26. The control unit 31 generates a control signal indicating a pulse train, and outputs the control signal to the second signal generating unit 26. The second signal generating unit 26 generates an alternating signal having the pulse train according to the control signal received from the control unit 31, and outputs the alternating signal to the RF coil 12. The RF coil 12 generates an electromagnetic wave signal having the pulse train according to the alternating signal received from the second signal generating unit 26. The first signal generating unit 25 and the second signal generating unit 26 may be implemented as ADCs for converting analog signals received from the control unit 31 into digital signals, oscillators for generating source signals, modulators for modulating the source signals according to signals received from the control unit 31, amplifiers for amplifying the signals modulated by the modulators, etc. Such amplified signals are sent to the coils 11, 12.

The first signal collecting unit 25 collects magnetic resonance signals induced by atomic nuclei through the RF coil 12. The first signal collecting unit 25 may be implemented as an amplifier for amplifying magnetic resonance signals received from the RF coil 12, a demodulator for demodulating the magnetic resonance signals amplified by the amplifier, a DAC for converting analog magnetic resonance signals demodulated by the demodulator into digital magnetic resonance signals, etc. The magnetic resonance signals converted into digital form are separately stored as acquired MRI data in the first non-transitory storage 33 and the second non-transitory storage 34. The first storage 33 and the second storage 34 are not necessarily physically separated storages but are spaces for separately storing different types of magnetic resonance signals. For example, the first storage 33 and the second storage 34 may be different storage regions of a hard disk. Alternatively, the first storage 33 and the second storage 34 may be combined and implemented by a single storage unit.

The RF coil 12 generates an electromagnetic wave from an alternating current applied from the second signal generating unit 26 to the RF coil 12, and receives an electromagnetic wave by a collection of signals by the signal collecting unit 27, and thus it is possible to freely adjust a time when the RF coil 12 generates a pulse and a time when the RF coil 12 receives the pulse.

In a preferred embodiment shown in FIG. 13, the image generating unit 32 performs the method for generating or reconstructing images from the acquired MRI data with image enhancement as described herein, based on a combined dynamic imaging MRI EPI and constrained reconstruction.

In an alternative exemplary embodiment of the present invention, as shown in FIG. 14, the apparatus performs the method for generating or reconstructing images from the MRI data with may include an image processing system 50 having a processor 55, a non-transitory memory for storing data and machine executable code including operational programs such as predetermined software 65, an input device 70, and an output device 75. The output device 75 may include the image outputting unit 35 of FIG. 13, which may be a display, a printer, etc. for displaying reconstructed MR images, or the output device 75 may be a communications interface for connecting to the image outputting unit. The input device 70 may include a keyboard, touchscreen and/or a mouse for receiving user inputs and selections, and may incorporate or be connected to the user interface 30 of FIG. 13. In addition, the input device 70 and the output device 75 may operate together as a graphic user interface (GUI), for example, provided to the user of the MRI apparatus by the user interface 30 in a manner known in the art. In alternative embodiments, the input device 70 and the output device 75 may include a touch screen to provide the GUI which responds to user touches, in a manner known in the art, for operating the image processing system of the present invention.

In the alternative exemplary embodiment, the image processing system 50 shown in FIG. 14 can be a stand-alone specialized computer, and the image reconstruction may be performed off-line; that is, independent of the image acquisition process of, for example, the MRI system of FIG. 13. Alternatively, the image reconstruction may be performed contemporaneously with the acquisition of images of a subject by the MRI system of FIG. 13.

With reference to FIG. 14, the image reconstruction is performed using customized software, and such predetermined software 65 may be generated using mathematical software development and authoring tools, such as MATLAB, a mathematical and numerical computing environment implemented as a software application commercially available from MATHWORKS, Natick, Mass., U.S.A. Alternatively, the predetermined software may be implemented by any known programming language or environment, for example, by using the C++ programming language. However, the claimed invention is not limited to these items.

The image processing system 50 receives and processes image data from an image data source 80 with the received image data stored in the memory. The image data source 80 may include the MRI apparatus of FIG. 13, which may be implemented using, for example, a 1.5T magnet as the main magnet 10, commercially available. In an alternative exemplary embodiment, the image data source 80 is operatively connected by a wired and/or wireless connection to the image processing system. The image data source 80 may also be embodied as one or both of the first storage 33 and the second storage 34 in FIG. 13 for receiving and storing data corresponding to RF signals, MR signals, and other known data signals from the respective coils 11, 12.

In further alternative embodiments, the image processing system 50 is connected, using a wired and/or wireless connection, to a computer network, such as the Internet, and receives the image data from at least one or even multiple remote sources, such as medical image data archives as the image data source. For example, the MRI images collected by a hospital or other MRI facilities, for example, using the apparatus of FIG. 13 or other known MRI apparatus, may store the images in a storage facility as the image data source, can be remotely accessed by the image processing system of the present invention using known communication devices and methods.

The image processing system 50 can be configured to process the image acquired via EPI. The image data source 80 can store, for example, the image data acquired via EPI, including fully sampling k-space profiles of a center segment of an object and undersampling k-space profiles of side segments adjacent/surrounding the center segment. Initially, there may be a linear ordering, then dividing the k-space profiles into $R_{EPI}$ segments, based on an EPI factor.

The above-described methods according to the present invention can be implemented in hardware, firmware or as software or computer code that is stored on a non-transitory machine readable medium such as a CD ROM, a RAM, thumbnail drive, a floppy disk, a hard disk, or a magneto-optical disk or computer code downloaded over a network originally stored on a remote recording medium or a non-transitory machine readable medium and stored on a local non-transitory recording medium, so that the methods described herein are loaded into hardware such as a general purpose computer, or a special processor or in programmable or dedicated hardware, such as an ASIC or FPGA. As would be understood in the art, all of the computer, the processor, microprocessor, controller, or the programmable hardware contain circuitry that is typically integrated, and can include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "controller", "processor" or "microprocessor" constitute hardware in the claimed invention. Under the broadest reasonable interpretation, the appended claims constitute statutory subject matter in compliance with 35 U.S.C. § 101 and none of the elements constitute of software per se.

The terms "unit" or "module" as may be used herein is to be understood as constituting or operating in conjunction with hardware such as a circuit, integrated circuit, processor, controller, or microprocessor configured for a certain desired functionality in accordance with statutory subject matter under 35 U.S.C. § 101, and such terms do not constitute software per se.

Any of the functions and steps provided in the Figures may be implemented in hardware, software or a combination of both and may be performed in whole or in part within the programmed instructions of a special computer. No claim element herein is to be construed under the provisions of 35 U.S.C. 112, sixth paragraph, unless the element is expressly recited using the phrase "means for".

We claim:

1. A method for reducing scan time in dynamic magnetic resonance (MR) imaging, the method comprising:
    acquiring a randomly under-sampled k-space with an Echo-Planar Imaging (EPI) pulse sequence technique; and
    reconstructing the under-sampled k-space utilizing a constrained reconstruction technique,
    wherein a center of the k-space is acquired first with linear ordering and then an outer k-space is acquired using radial profile ordering,
    wherein linear ordering comprises line-by-line ordering, and
    wherein radial ordering comprises acquiring a first line from the center of the k-space to the outer k-space and acquiring subsequent lines from the center of the k-space to the outer k-space in a continuous rotation.

2. The method according to claim 1, wherein the dynamic MRI imaging comprises one of dynamic contrast enhanced or phase contrast MRI.

3. The method according to claim 1, wherein the constrained reconstruction technique comprises a Total Variation (TV) reconstruction technique or LOw-dimensional-structure Self-learning and Thresholding (LOST) reconstruction technique.

4. The method according to claim 1, wherein the constrained reconstruction technique comprises a randomly undersampled y-z reconstruction technique.

5. The method according to claim 1, wherein the constrained reconstruction comprising a compressed sensing (CS) reconstruction technique.

6. The method according to claim 1, wherein the random undersampling pattern comprises a uniform undersampling pattern or a non-uniform undersampling pattern.

7. The method according to claim 1, wherein an EPI factor and a (CS) acceleration rate are both greater than 1.

8. The method according to claim 7, wherein the EPI factor is 3 or 5.

9. The method according to claim 8, wherein the EPI factor is 7 or 9.

10. The method according to claim 8, wherein the CS acceleration rate is 2 or 3 or 4 or 5.

11. The method according to claim 1, wherein the k-space is divided into a center area and an outer area, each with a respective EPI factor.

12. The method according to claim 11, wherein the k-space is randomly undersampled by a factor of $R_{cs}$, and the EPI pulse sequence divides the k-space into $R_{EPI}$ segments based on the EPI factor.

13. The method of claim 12, wherein a reduction in scan time is based on $R_{EPT} \times R_{cs}$.

14. The method of claim 1, wherein a center area of the k-space is fully sampled, and an outer area is randomly undersampled.

15. The method of claim 1, wherein the EPI pulse sequence technique is provided for 2D or 3D imaging.

16. The method of claim 1, wherein the EPI pulse sequence technique is provided for accelerated dynamic imaging.

17. An apparatus for a magnetic resonance image (MRI) system for obtaining dynamic MRI image data with reduced eddy currents and scanning time, the apparatus comprising:

an image processing system including a processor having circuitry configured to:

acquire a randomly under-sampled k-space with an Echo-Planar Imaging (EPI) pulse sequence technique; and reconstruct under-sampled k-space data utilizing a constrained reconstruction technique, wherein the processor is configured to acquire a center of the k-space first with linear ordering and then an outer k-space using radial profile ordering, wherein linear ordering comprises line-by-line ordering, and wherein radial ordering comprises acquiring a first line from the center of the k-space to the outer k-space and acquiring subsequent lines from the center of the k-space to the outer k-space in a continuous rotation;

a control unit configured to control at least the image processing system.

18. The apparatus according to claim 17, further comprising a non-transitory memory for storing data and machine executable code.

19. The apparatus according to claim 17, wherein the constrained reconstruction technique that the processor is configured for comprises a Total Variation (TV) reconstruction technique, or LOw-dimensional-structure Self-learning and Thresholding (LOST) reconstruction technique.

20. The apparatus according to claim 17, wherein the constrained reconstruction technique that the processor is configured for comprises a randomly undersampled y-z reconstruction technique.

21. The apparatus according to claim 17, wherein the constrained reconstruction technique that the processor is configured for comprises a compressed sensing (CS) reconstruction technique.

22. The apparatus according to claim 17, wherein the dynamic MRI image comprises one of dynamic contrast enhanced or phase contrast MRI.

23. The apparatus according to claim 17, wherein the processor is configured so that the center of the k-space is fully sampled and the outer k-space is randomly undersampled.

24. The apparatus according to claim 17, further comprising:

a main magnet that generates a static magnetic field for arranging directions of magnetic dipole movements of atomic nuclei;

a gradient coil that generates a gradient magnetic field;

an RF coil under control of the control unit;

a first signal generating unit in communication with the control unit generate a first signal to generate the magnetic field in the gradient coil and RF coil; and a signal collecting unit.

\* \* \* \* \*